US010666257B1

(12) United States Patent
Srinivasan et al.

(10) Patent No.: US 10,666,257 B1
(45) Date of Patent: May 26, 2020

(54) FAILSAFE, ULTRA-WIDE VOLTAGE INPUT OUTPUT INTERFACE USING LOW-VOLTAGE GATE OXIDE TRANSISTORS

(71) Applicant: TEXAS INSTRUMENTS INCORPORATED, Dallas, TX (US)

(72) Inventors: Srikanth Srinivasan, Bengaluru (IN); Devraj Rajagopal, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/502,198

(22) Filed: Jul. 3, 2019

(30) Foreign Application Priority Data

Nov. 2, 2018 (IN) ............................ 201841041540

(51) Int. Cl.
*H03K 19/007* (2006.01)
*H03K 19/0185* (2006.01)

(52) U.S. Cl.
CPC ... *H03K 19/007* (2013.01); *H03K 19/018521* (2013.01)

(58) Field of Classification Search
None
See application file for complete search history.

(56) References Cited

U.S. PATENT DOCUMENTS

2009/0027089 A1* 1/2009 Hebenstreit ...... H03K 19/01852 327/108
2009/0089605 A1 4/2009 Westwick et al.
2010/0097117 A1* 4/2010 Wang .............. H03K 3/356113 327/333
2011/0241752 A1* 10/2011 Wang .............. H03K 3/356113 327/319
2015/0091608 A1 4/2015 Rajagopal et al.
2015/0365079 A1 12/2015 Tsai
2017/0207050 A1 7/2017 Sugiura et al.

* cited by examiner

*Primary Examiner* — Anh Q Tran
(74) *Attorney, Agent, or Firm* — John R. Pessetto; Charles A. Brill; Frank D. Cimino

(57) ABSTRACT

A wide-voltage range, failsafe output interface module including a low-voltage, drain extended MOSFETs has been proposed to prevent the flow of reverse current during a failsafe operation while ensuring the MOSFETs are not subject to voltage over their voltage tolerance levels, improving reliability of an output interface module without resorting to more costly transistors with thicker films.

13 Claims, 8 Drawing Sheets

FAILSAFE, ULTRA-WIDE VOLTAGE INPUT OUTPUT INTERFACE USING LOW-VOLTAGE GATE OXIDE TRANSISTORS

RELATED APPLICATIONS

This application claims priority to Indian Provisional Application No. 201841041540, filed Nov. 2, 2018, which is hereby incorporated by reference.

BACKGROUND

In integrated chip (IC) designs, hot-swapping refers to an ability of an IC interface to handle external interruptions, such as interruptions due to adding of a device to a bus on a fly. ICs supporting hot-swap require an output interface driving an output pin connected to a bus to be failsafe. In other words, the output interface shall not draw current from the output pin or the bus when a current or voltage supply to the output interface is down and the output pin is driven externally by another device connected to the bus.

ICs may employ low-voltage thin-film transistors with low voltage tolerance (e.g., 5V) for cost saving. These ICs are nonetheless expected to support legacy interfaces with high-voltage supplies (e.g., 10V). Other families of ICs, such as voltage supervisors, expect to its output interface to monitor and be driven by a wide-range high-voltage supply (e.g., 1.5V~10V). Accordingly, there is a need for an IC interface design to withstand high-voltage applications and avoid voltage stress on its low-voltage thin-film transistors.

SUMMARY

An aspect of the present invention provides an output interface module including a pull-up circuitry coupled to a level shifter, which provides at least two different levels of turn-on voltage to the pull-up circuitry depending on a level of voltage supplied to the pull-up circuitry. The difference between the turn-on voltage and voltage supplied to the pull-up circuitry is regulated to avoid voltage stress on transistors included in the output interface module.

Yet another aspect of the present invention provides an output interface module including a pull-up circuitry coupled to a pull-down circuitry, which is coupled to an output pin of the output interface module. The pull-up circuitry incorporates a PMOS transistor and the pull-down circuitry incorporates a NMOS transistor. The PMOS transistor of the pull-up circuitry is coupled to the NMOS transistor of the pull-down circuitry in push-pull configuration to generate a data signal and output corresponding levels of voltage to the output pin. The PMOS transistor and NMOS transistor may comprise a drain extended transistor that can withstand higher voltage across its drain-gate, drain-source, and drain-bulk nodes, while maintaining a thin-film architecture.

BRIEF DESCRIPTION OF THE DRAWINGS

For a detailed description of various examples, reference will now be made to the accompanying drawings in which.

DETAILED DESCRIPTION

In this description, the term “couple” or “couples” means either an indirect or direct wired or wireless connection. Thus, if a first device couples to a second device, that connection may be through a direct connection or through an indirect connection via other devices and connections. The recitation “based on” means “based at least in part on.” Therefore, if X is based on Y, X may be a function of Y and any number of other factors.

Further, in the following detailed description, reference is made to certain examples of the present invention. These examples are described with sufficient detail to enable those skilled in the art to practice them. It is to be understood that other examples may be employed and that various structural, logical, and electrical changes may be made. Modifications are possible in the described embodiments, and other embodiments are possible, within the scope of the claims.

Figure 1:
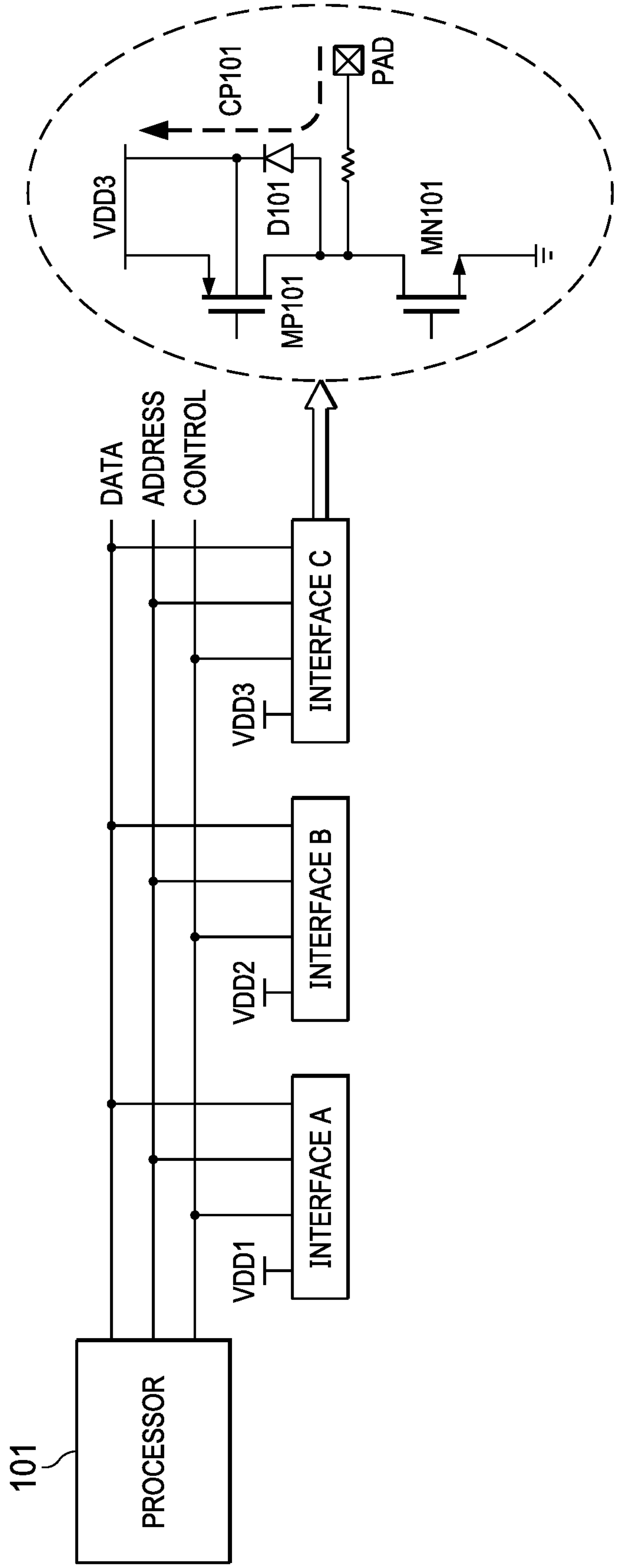
FIG. 1 illustrates an exemplary IC output interface architecture.

FIG. 1 illustrates an exemplary IC output interface architecture. As illustrated, each of IC output interfaces, Interface A, Interface B, and Interface C, is coupled to processor 101 through multiple buses, Data, Address, and Control. Each of IC output interfaces, Interface A, Interface B, and Interface C, is driven by its respective voltage supply, VDD1, VDD2, and VDD3. On the right is a scaled illustration of IC output interface, Interface C.

Interface C comprises PMOS transistor MP101 and NMOS transistor MN101 coupled to each other to form a push-pull configuration driving pin PAD connected to one of buses Data, Address, and Control. The pin PAD is driven based on an incoming data signal with high and low values. When voltage supply VDD3 is down and pin PAD is driven externally, body diode D101 of PMOS transistor MP101 is forward biased, creating reverse current path CP101 from pin PAD to voltage supply VDD3. A failsafe operation prevents such forward bias to body diode D101 of PMOS transistor MP101, preventing a reverse current and/or voltage flow.

Figure 2:
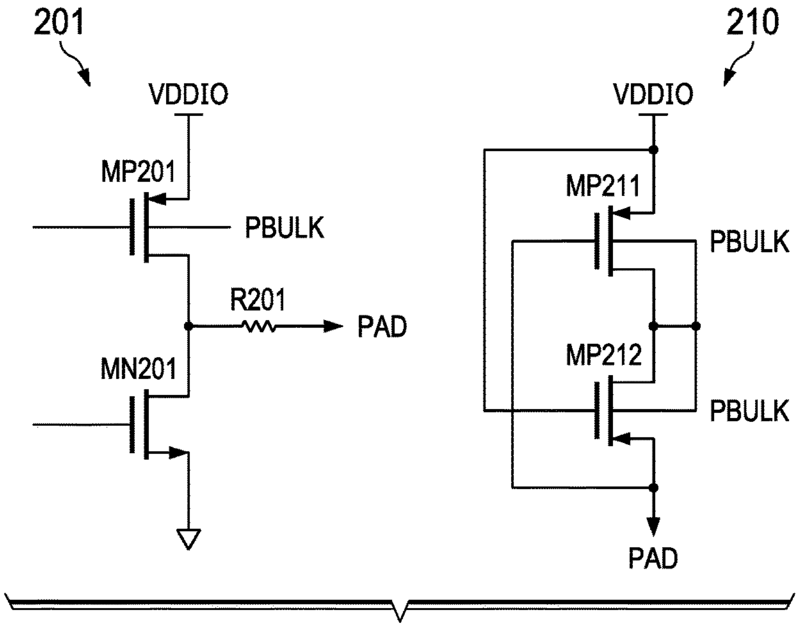
FIG. 2 illustrates an IC output interface architecture according to prior art.

FIG. 2 illustrates an IC output interface architecture according to prior art to failsafe the output interface. In the prior art output interface of FIG. 2, supplementary voltage comparison circuit 210 selects the higher of supply voltage VDDIO and voltage applied to pin PAD, and biases PMOS transistor MP201 of output interface 201 at all times. During a normal operation of output interface 201 when voltage supply VDDIO supplies voltage to PMOS transistor MP201, the supplied voltage is output to pin PAD through a push-pull configuration of coupled PMOS transistor MP201 and NMOS transistor MN201, and resistor R201. Because voltage supply VDDIO is on, PMOS transistor MP212 of supplementary voltage comparison circuit 210 is turned off, and bulk PBULK of supplementary voltage comparison circuit 210 outputs the VDDIO's voltage supplied to supplementary voltage comparison circuit 210 to bulk PBULK of output interface 201.

During a failsafe operation, when voltage supply VDDIO is off and pin PAD of output interface 201 is driven externally, PMOS transistor MP211 of supplementary voltage comparison circuit 210 turned off and PMOS transistor MP212 of supplementary voltage comparison circuit 210 is turned on. As a result, supplementary voltage comparison circuit 210 outputs voltage supplied via pin PAD to bulk PBULK of supplementary voltage comparison circuit 210, which in turn is provided to bulk PBULK of output interface 201. Accordingly, the internal body diode of PMOS transistor MP201 of output interface 201 is turned off, and any potential channel current from pin PAD of output interface 201 to its voltage supply VDDIO is blocked. The architecture of FIG. 2, however, suffers from reliability issues in high-voltage application. For example, where voltage at pin PAD of supplementary voltage comparison circuit 210 is 10V, PMOS transistors MP211 and MP212 respectively experience a gate-source and gate-bulk stress of 10V. To replace PMOS transistors to expensive transistors with thicker oxide films increases manufacturing costs.

Figure 3:
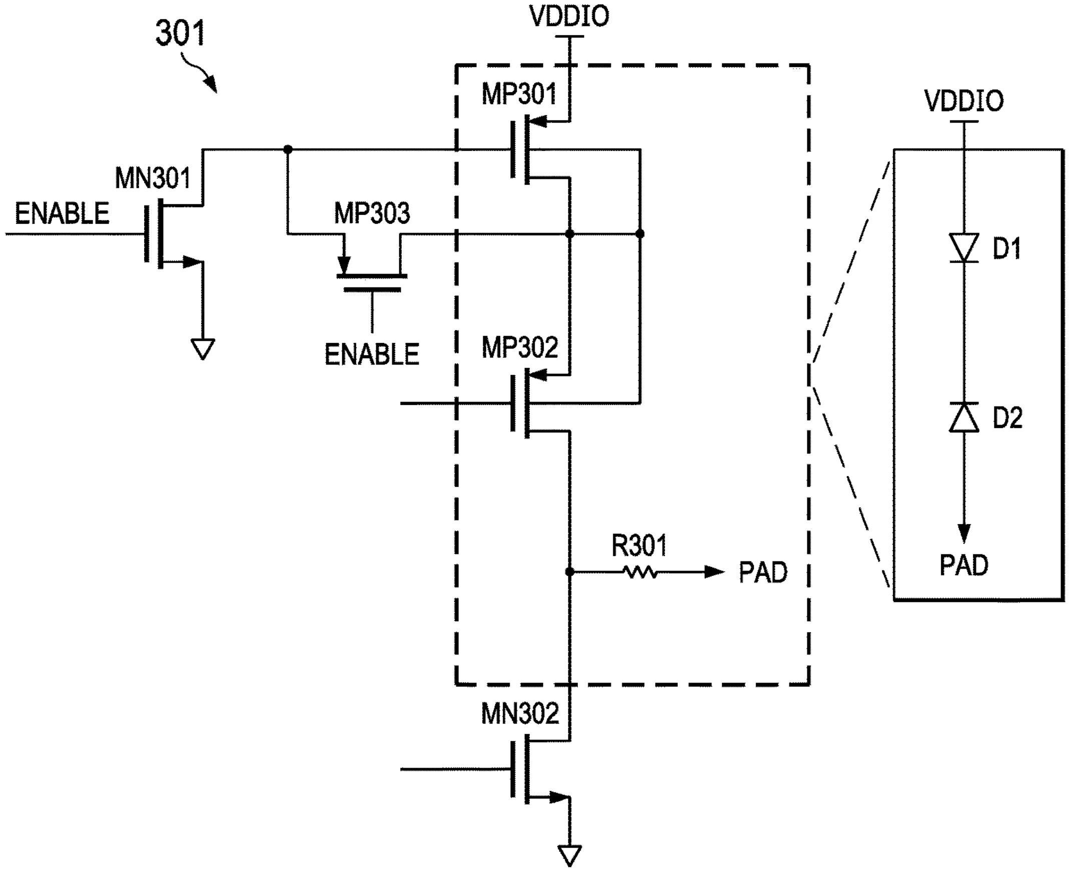
FIG. 3 illustrates an IC output interface architecture according to yet another prior art.

FIG. 3 illustrates an IC output interface architecture according to yet another prior art. In FIG. 3, a prior art IC output interface 301 includes a cascoded configuration of two series PMOS transistors MP301 and MP302 whose bulks are tied to each other and their respective source and drain nodes. PMOS transistor MP302 is driven internally to forward voltage supplied by voltage supply VDDIO to pin PAD as data signal output. PMOS transistor MP301 is driven by NMOS transistor MN301 controlled by signal ENABLE of output interface 301. Pass PMOS transistor MN303 connected the gate and drain of PMOS transistor MP301.

During a normal operation, when output interface 301 is enabled via signal ENABLE, pass PMOS transistor MP303 is turned off, and NMOS transistor MN301 is turned on, pulling the gate of PMOS transistor MP301 to 0V to turn it on. This effectively turns PMOS transistor MP301 into a switch, the switching of which is controlled by PMOS transistor MP302, and NMOS transistor MN302 coupled to PMOS transistor MP302 in a push-pull configuration. The voltage supplied to output interface 301 by voltage supply VDDIO is provided to pin PAD via resistor R301 as data signal output.

During a failsafe operation, voltage supply VDDIO is down, and signals ENABLE and signals provided to PMOS transistor MP302 and NMOS transistor 302 are at 0V. Accordingly, NMOS transistor MN301 is turned off and PMOS transistor MP303 is turned on, which in turn connects the gate of PMOS transistor MP301 to its drain and effectively turns PMOS transistor MP301 to act as its body diode D1. When pin PAD is driven high, the reverse-biased body diode D1 of PMOS transistor MP301 blocks any channel current through body diode D2 of PMOS transistor MP302. Additionally, connecting the bulks of PMOS transistors MP301 and MP302 places their respective body diodes D1 and D2 out of phase with each other, effectively cutting off current from pin PAD.

The prior art output interface of FIG. 3, however, also suffers reliability issues in high-voltage application, such as when pin PAD is driven by an external voltage higher than the voltage the oxides of PMOS transistors MP301 and MP302 can withstand. For instance, when voltage supply VDDIO is down and pin PAD is driven by an external voltage of 10V, the oxide of PMOS transistor MP302 designed to withstand only 5V will be subject to 10V stress across its gate and source, and its gate and drain. Similar to output interface 201 of FIG. 2, replacing the transistors of output interface 301 of FIG. 3 would increase its manufacturing costs.

An aspect of the present invention provides an output interface module with a circuitry design to prevent application of high-voltage on the transistors of the output interface module. According to an aspect of the present invention, a level shifter is configured to provide at least two different ranges of voltages to an output interface module to regulate the level of voltage applied to the output interface module's transistors. One of at least two different ranges of voltage is selected to be applied to the output interface module based on a level of voltage supplied to the output interface module by a voltage supply.

According to yet another aspect of the present invention, an output interface module employs a drain-extended MOSFET (De-MOS). De-MOS are asymmetric transistors whose drains have been extended by the addition of an isolated compensated p-well (or n-well in case of drain-extended NMOS). This increases the breakdown voltage and hence the voltage withstanding capacity of the transistor across its drain-gate, drain-source and drain-bulk nodes. As a result, a thin oxide MOSFET can operate reliably when a voltage higher than its rating is applied at its drain. For example, a 5V De-MOS can withstand only 5V across gate-bulk and gate-source, but 12V across drain-gate, drain-source and drain-bulk nodes. The construction of this device necessitates no additional mask and hence translates to savings in manufacturing cost and die area.

Figure 4:
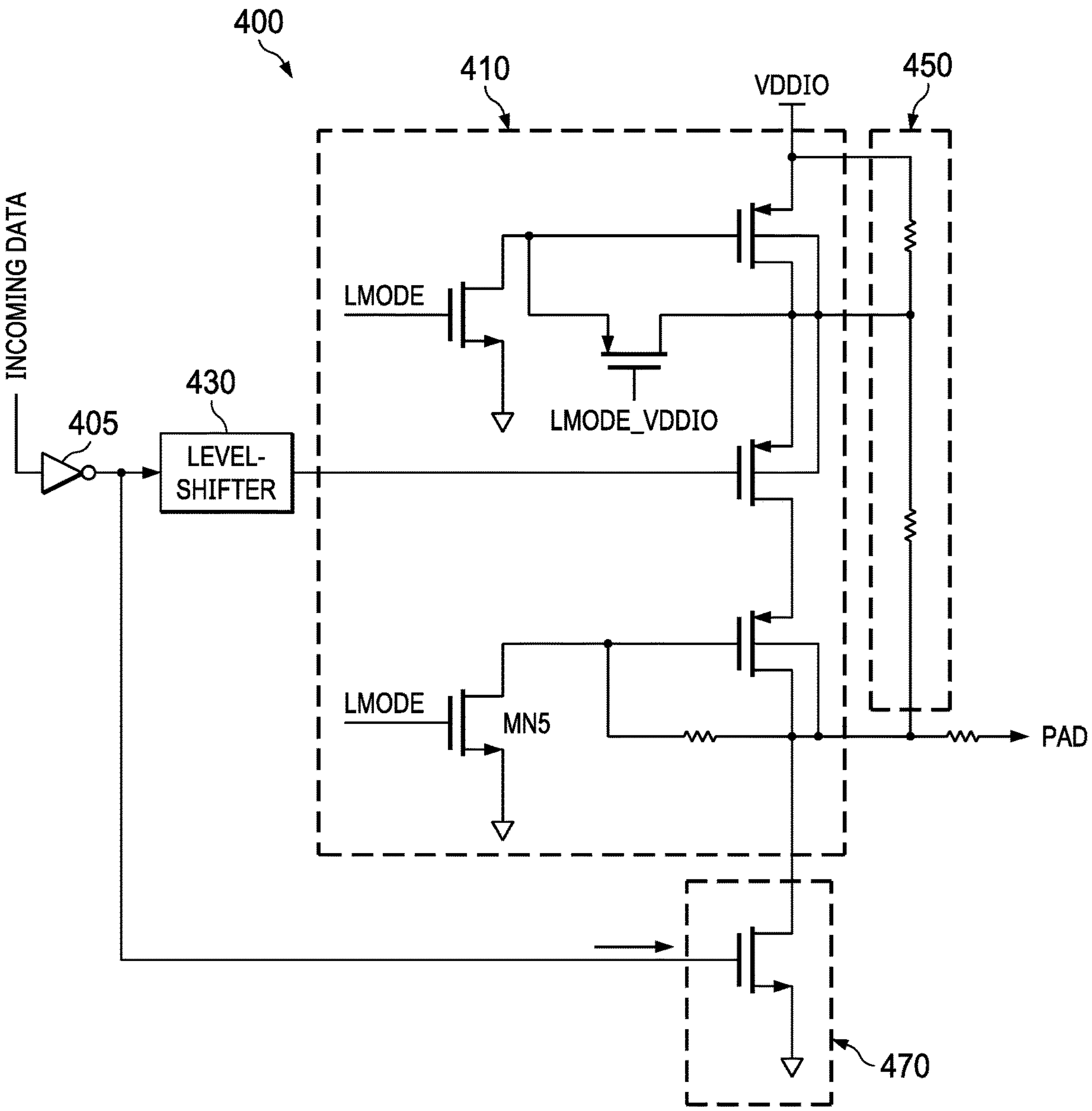
FIG. 4 illustrates an IC output interface module according to an aspect of the present invention.

FIG. 4 illustrates an IC output interface module according to an aspect of the present invention. The output interface module 400 of FIG. 4 includes pull-up circuitry 410, level shifter 430, voltage regulating circuitry 450, and pull-down circuitry 470. Pull-up circuitry 410 and pull-down circuitry 470, which are coupled to each other, are each coupled to output pin PAD. Based on data incoming to output interface module 400, pull-up circuitry 410 and pull-down circuitry 470 respectively outputs high voltage and low voltage to output pin PAD. The high voltage output from output pin PAD corresponds to high logic signal and the low voltage output corresponds to low logic signal.

The transistors of pull-up circuitry 410 and pull-down circuitry 470 may be De-MOS to withstand voltage stress of over 5V across their gate-drain, gate-source, and gate-bulk nodes. The operations of these transistors will be further explained below in relation to FIGS. 6-10.

Voltage supply VDDIO to output interface module 400 may provide a voltage of wide-range. For instance, it may provide a voltage within a range of 0V~10V. Signal LMODE is provided to pull-up circuitry 410 based on a level of voltage output from voltage supply VDDIO and a voltage tolerance level of one or more transistors of output interface module 400. In the example of FIG. 4, one or more transistors of output interface module has a voltage tolerance VSAFE of 5V. When voltage from voltage supply VDDIO swings within a range of 0V~5V, the value of signal LMODE is "1". When voltage from voltage supply VDDIO is over 5V and equal to or less than 10V, the value of signal LMODE is "0".

Signal LMODE may be externally supplied through a pin of output interface module 400 based on the level of voltage operating output interface module 400 or voltage supply VDDIO. Alternatively, signal LMODE may be generated on chip using a comparator topology that sets signal LMODE to “0” as soon as voltage from voltage supply VDDIO goes beyond a transistor’s voltage tolerance level VSAFE.

Figure 5:
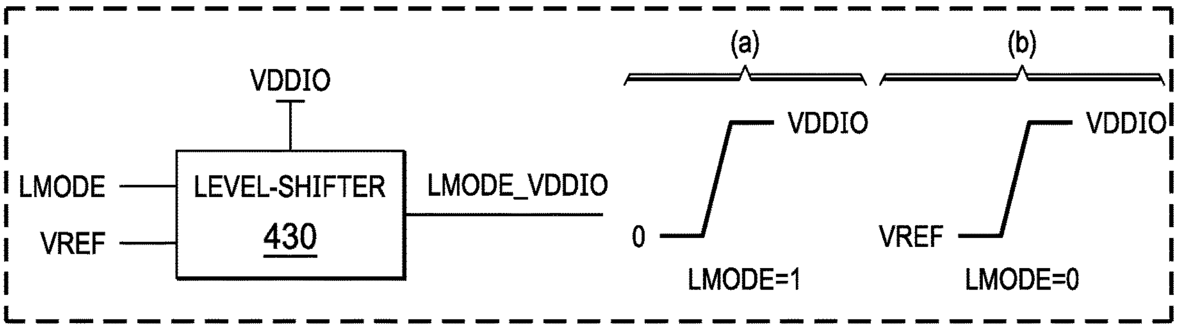
FIG. 5 illustrates a level shifter of the IC output interface module of FIG. 4.

Level shifter 430 is configured to provide at least two different ranges of voltage to pull-up circuitry 410 based on the voltage level of voltage supply VDDIO. FIG. 5 illustrates level shifter 430 with voltage outputs thereof. When the voltage of voltage supply VDDIO is above zero but equal to or less than a transistor’s voltage tolerance level, signal LMODE is set to “1”. When signal LMODE is set to “1”, level shifter 430 outputs voltage that swings between 0V and voltage of voltage supply VDDIO as illustrated in signal form (a) of FIG. 5.

When the voltage of voltage supply VDDIO is above a transistor’s voltage tolerance level, signal LMODE is set to “0”. When signal LMODE is set to “0”, level shifter 430 outputs voltage that swings between voltage VREF and voltage of voltage supply VDDIO as illustrated in signal form (b) of FIG. 5. Voltage VREF is a reference voltage chosen to prevent voltage exceeding a voltage tolerance level of a transistor of pull-up circuitry 410 from applying to the transistor. For instance, voltage VREF may be 5V when voltage supply VDDIO outputs 5V and a transistor of pull-up circuitry 410 is 5V De-MOS. By shifting the level of low voltage provided to pull-up circuitry 410 when voltage of voltage supply VDDIO is 10V, level shifter 430 prevents a voltage above a voltage tolerance level VSAFE from being applied to a transistor of pull-up circuitry, such as 5V De-MOS. Accordingly, a reliable operation is ensured.

Level shifter 430 may be implemented with a conventional level-shifting topology with auxiliary arms for low-voltage operations.

Signal LMODE_VDDIO is also provided to pull-up circuitry 410 to turn on a transistor of pull-up circuitry 410 based on the voltage level of voltage supply VDDIO. The waveform of signal LMODE-VDDIO follows signal LMODE, but it is shifted to a voltage level sufficient to operate a transistor of pull-up circuitry when voltage of voltage supply VDDIO is above voltage VSAFE. In one example, level shifter 430 level shifts signal LMODE to correspond to the voltage level of voltage supply VDDIO and provides to pull-up circuitry 410 as signal LMODE_VDDIO.

Figure 6:
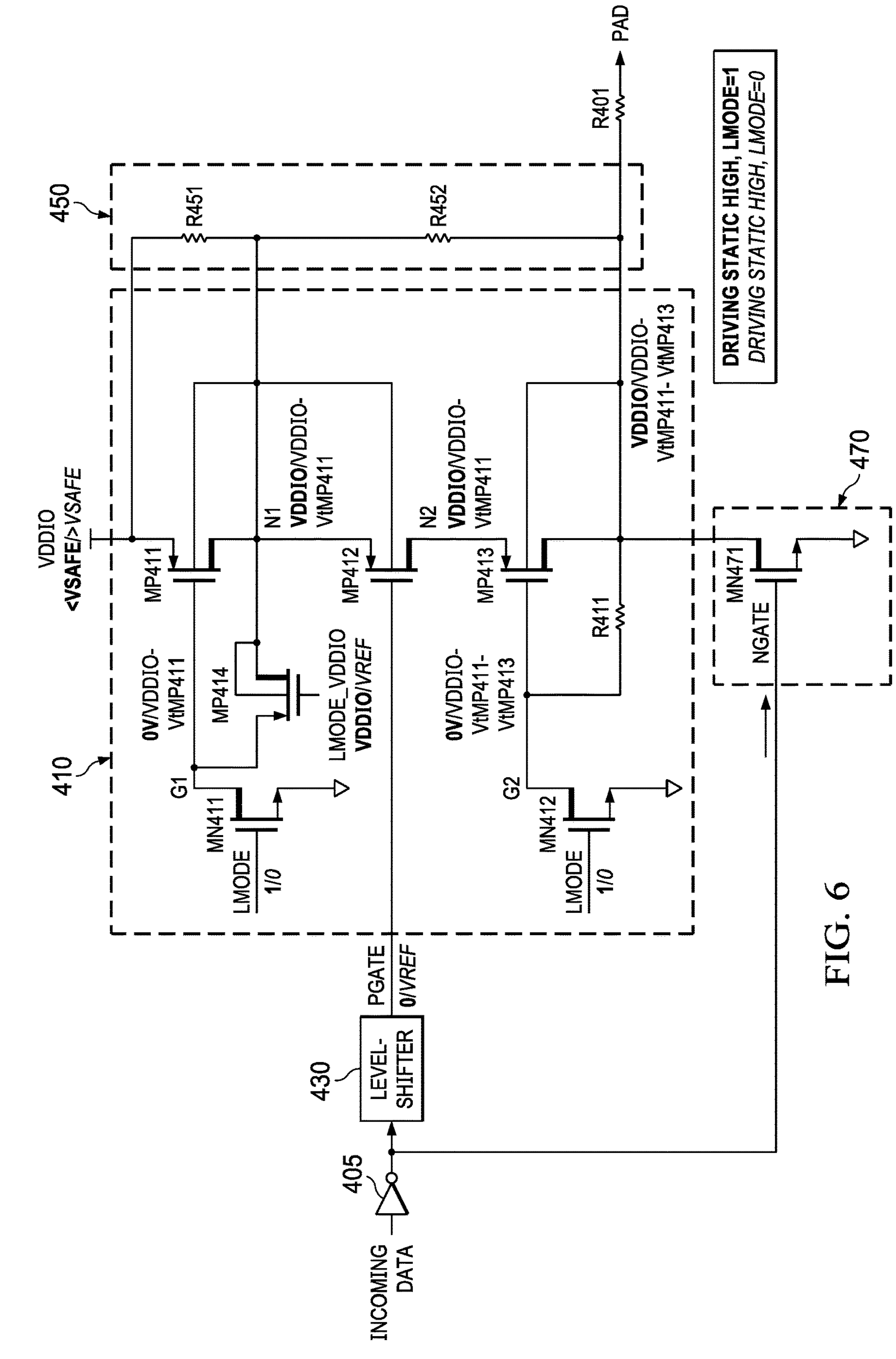
FIG. 6 illustrates the IC output interface module of FIG. 4 during a regular operation.
Figure 7:
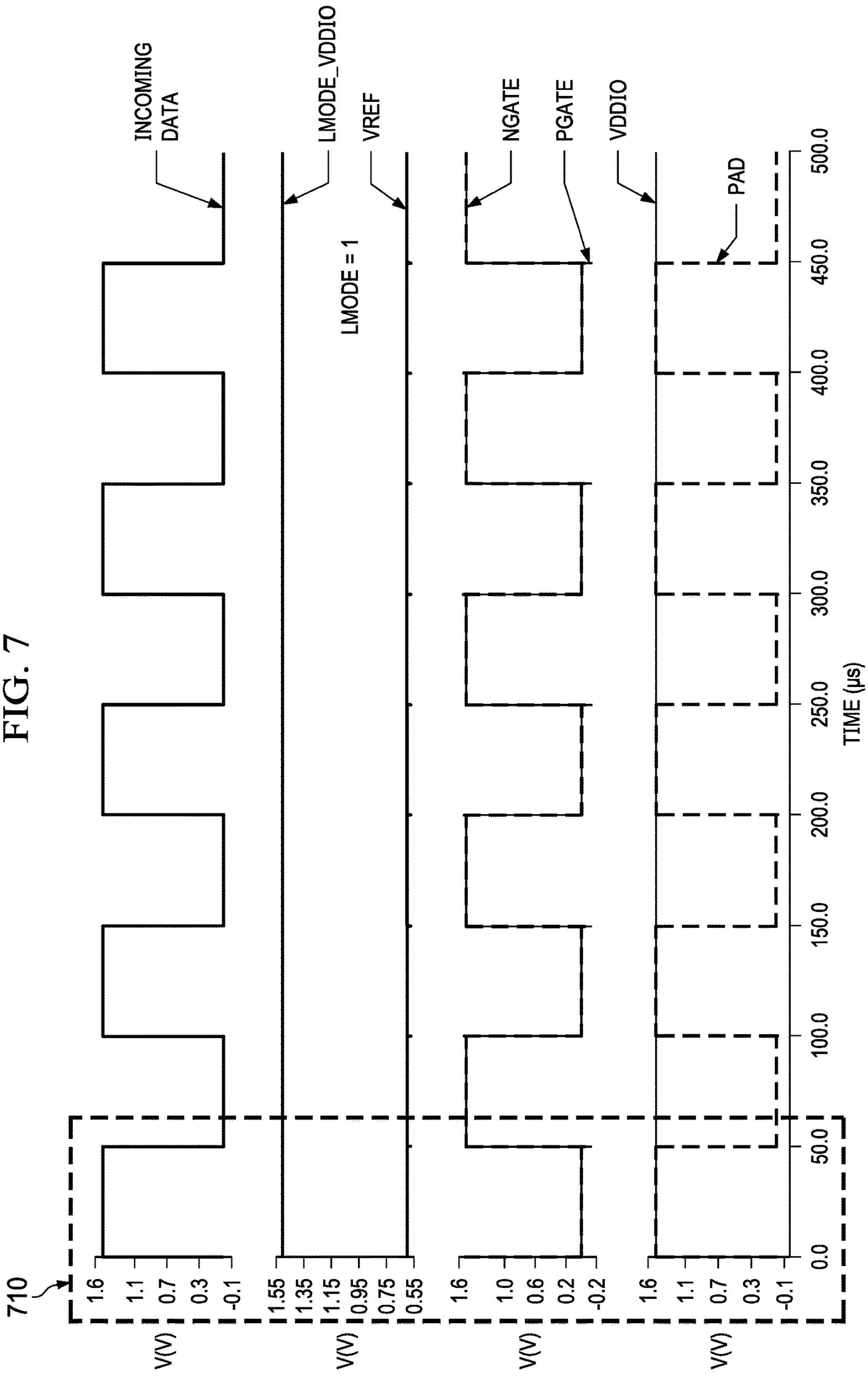
FIGS. 7-8 illustrate signals of the IC output interface module of FIG. 4 during a regular operation.
Figure 8:
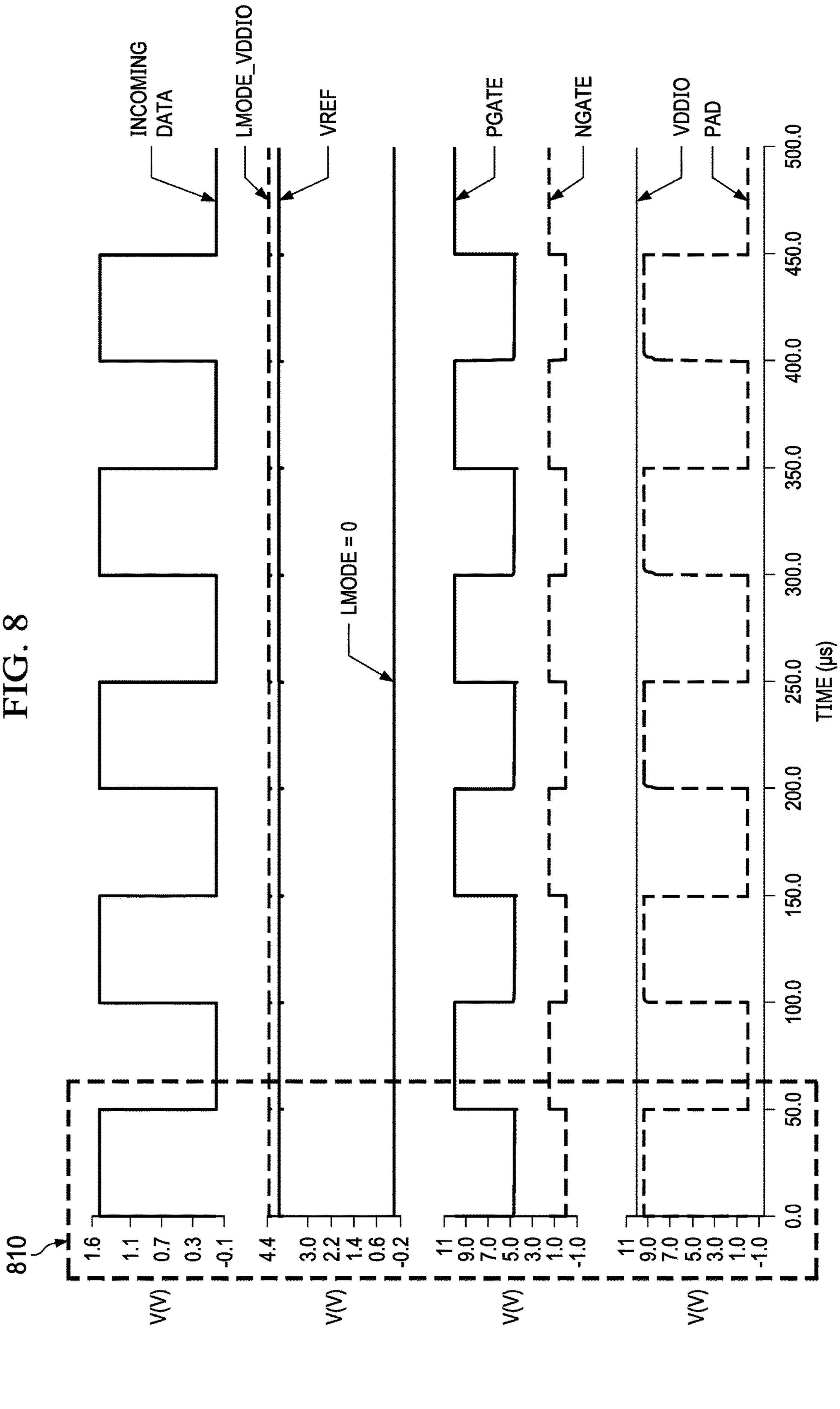

FIG. 6 illustrates the voltage and signals of IC output interface module of FIG. 4 during a regular operation, and FIGS. 7-8 illustrate signals of the IC output interface module of FIG. 4 during the operation. Pull-up circuitry 410 of output interface module 400 includes three cascoded PMOS transistors MP411, MP412, and MP413 to drive high output pin PAD. In one example, PMOS transistors MP411, MP412, and MP413 may be De-PMOS. Pull-down circuitry 470 of output interface module 400 includes NMOS transistor MN471 to drive low output pin PAD.

PMOS transistor MP412 is driven by level shifter 430 based on signal Incoming Data of highs and lows. When signal Incoming Data is high, PMOS transistor MP412 is turned on, and when signal Incoming Data is low, PMOS transistor MP412 is turned off. Pull-up circuitry 410 further includes NMOS transistors MN411 and MN412 driven by signal LMODE. NMOS transistor MN411 and MN412, in turn, respectively drives PMOS transistors MP411 and MP413. The bulks of PMOS transistors MP411 and MP412 are tied to each other and to a common source-drain node N1. The bulk of PMOS transistor MP413 is connected to its own drain.

Pull-up circuitry 410 further includes PMOS transistor MP414 connecting the gate of PMOS transistor MP411 to its drain when turned on. The gate of PMOS transistor MP413 is connected through resistor R411 to its drain.

The gate of PMOS transistor MP414 is driven by signal LMODE_VDDIO from level shifter 430. Signal LMODE_VDDIO swings between 0V and voltage of voltage supply VDDIO when signal LMODE is “1”. Signal LMODE_VDDIO swings between VREF and voltage of voltage supply VDDIO when signal LMODE is “0”. When LMODE is “1”, PMOS transistor MP414 is turned on when LMODE_VDDIO signal is close to 0V and turned off when LMODE_VDDIO signal is close to voltage of voltage supply VDDIO. When LMODE is “0”, PMOS transistor MP414 is turned on when LMODE_VDDIO signal is close to VREF and turned off when LMODE_VDDIO signal is close to voltage of voltage supply VDDIO. By shifting the levels of voltage supplied to PMOS transistor MP414 based on the voltage level of supply voltage VDDIO, output interface module 410 maintains voltage applied to PMOS transistor MP414 within its voltage tolerance range.

NMOS transistor 471 of Pull-down circuitry 470 is turned on and off based on signal Incoming Data of highs and lows. When signal Incoming Data is high, NMOS transistor MP471 is turned off, and when signal Incoming Data is low, NMOS transistor MP471 is turned on.

Voltage regulating circuitry 450 includes resistors R451 and R452, which are connected in series between voltage supply VDDIO and output pin PAD. Resistors R451 and R452 are high-valued resistors. Resistors R451 and R452 bias common source-drain node N1 as further described below during normal and failsafe operations.

In FIG. 6, voltages and signal values of output interface module 400 is reflected next to their respective node or signal reference. For instance, in FIG. 6, signal LMODE is set to either “1” or “0”.

When signal LMODE is set to “1”, or when voltage supplied by voltage supply VDDIO is below voltage VSAFE, NMOS transistors MN411 and MN412 are turned on. Further signal LMODE_VDDIO is set to the voltage provided by voltage supply VDDIO, which turns off PMOS transistor MP414. Output interface module 400 further includes high value resistor 411. Accordingly, both node G1 and node G2 are pulled to 0V, which respectively turns on PMOS transistors MP411 and MP413.

When signal LMODE is set to “1”, PMOS transistor MP412 is driven by a full-swing level-shifter 430 whose output swings between 0V and voltage of voltage supply VDDIO based on signal Incoming Data. Inverter 405 inverts signal Incoming Data to provide to level shifter 430. Where signal Incoming Data is a high, as illustrated in section 710 of FIG. 7, inverter 405 outputs 0V to level shifter 430. In response, level shifter 430 outputs 0V to PGATE and PMOS transistor MP412 is turned on. Accordingly, voltage at node N1 and node N2 is equal to voltage supplied by voltage supply VDDIO. Inverter 405 also outputs the inverted signal to NMOS transistor MN471 of pull-down circuitry 470 via NGATE, which turns off NMOS transistor MN471. As PMOS transistor MP412 is turned on and NMOS transistor MN471 is turned off, pull-up circuitry 410 outputs voltage provided by voltage supply VDDIO to output pin PAD via resistor 401 as high logic data, as illustrated in section 710 of FIG. 7.

Conversely, when signal Incoming Data is low, NMOS transistor MN471 of pull-down circuitry 470 is turned on and PMOS transistor MP412 of pull-up circuitry is turned off and low voltage of 0V is provided to output pin PAD as low logic signal. VREF output of level shifter 430 is negligible to the operation of output interface module 400 when signal LMODE is set to "1".

When signal LMODE is set to "0", or when voltage supplied by voltage supply VDDIO is over voltage VSAFE, NMOS transistors MN411 and MN412 of pull-up circuitry 410 are turned off, and signal LMODE_VDDIO is set to voltage VREF, which is provided by level shifter 430. Accordingly, PMOS transistor MP414 is turned on and PMOS transistors MP411 and MP413 are connected in diode configuration respectively through the turned on PMOS transistor MP414 and resistor R411. Voltage at node N1 is equal to the voltage supplied by voltage supply VDDIO minus the threshold voltage of PMOS transistor MP411, VtMP411, and the voltage at node G1 is equal to the voltage at N1.

When signal LMODE is set to "0", PMOS transistor MP412 of pull-up circuitry 410 is driven by a voltage output from a reduced-swing level shifter 430, the voltage output of which only swings between VREF and the voltage of voltage supply VDDIO. Accordingly, when signal Incoming Data is a high, as illustrated in section 810 of FIG. 8, level shifter 430 outputs voltage VREF to PGATE, which turns on PMOS transistor MP412.

When PMOS transistor MP412 is on, voltage at node N2 is equal to the voltage supplied by voltage supply VDDIO minus the threshold voltage of PMOS transistor MP411, VtMP411. Further, when PMOS transistor MP412 is on, voltage at the drain of PMOS transistor MP413 is equal to the voltage supplied by voltage supply VDDIO minus the threshold voltage of PMOS transistor MP411, VtMP411, and the threshold voltage of PMOS transistor MP413, VtMP413. The voltage at node G2 is equal to the voltage at the drain of PMOS transistor MP413.

Also, when signal Incoming Data is high, 0V is applied to NGATE, which turns off NMOS transistor 471 of pull-down circuitry 470. As a result, pull-up circuitry 410 outputs the voltage provided by voltage supply VDDIO minus VtMP411 and VtMP413 to output pin PAD as high logic data, as illustrated in section 810 of FIG. 8. Conversely, when signal Incoming Data is low, NMOS transistor MN471 of pull-down circuitry 470 is turned on and PMOS transistor MP412 of pull-up circuitry is turned off and low voltage of 0V is provided to output pin PAD as low logic signal.

Figure 9:
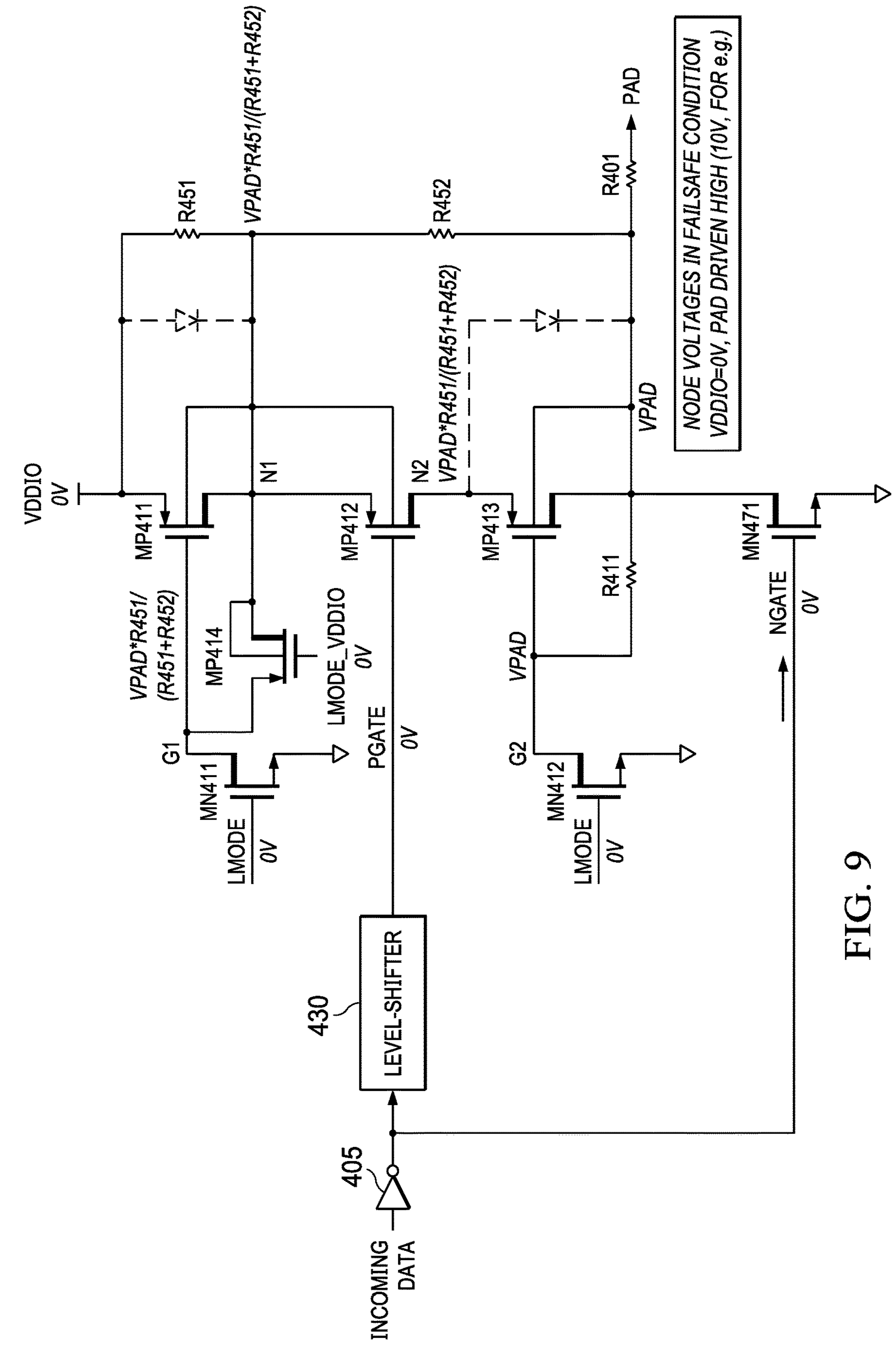
FIG. 9 illustrates the IC output interface module of FIG. 4 during a failsafe operation.
Figure 10:
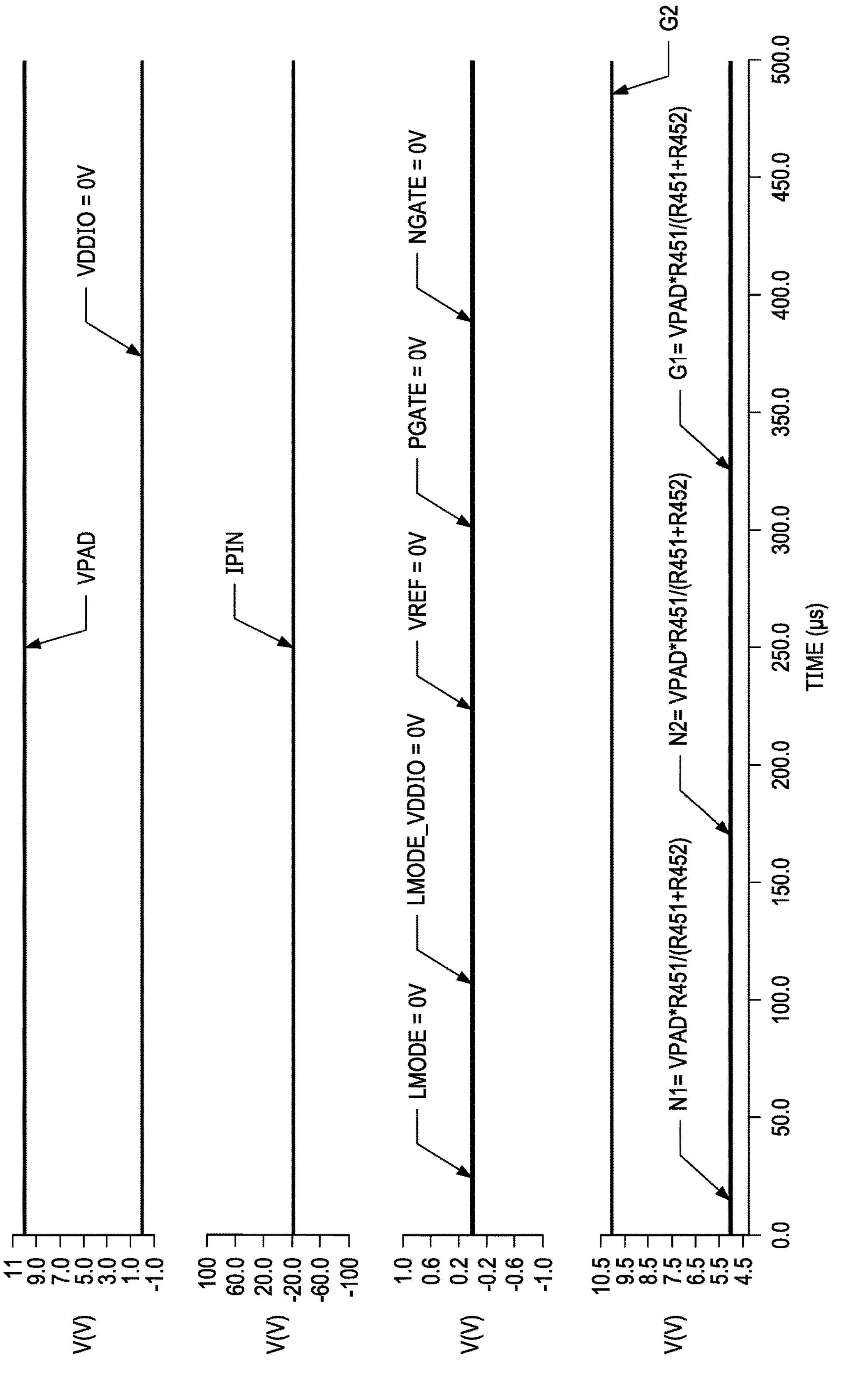
FIG. 10 illustrates signals of the IC output interface module of FIG. 4 during a failsafe operation.

FIG. 9 illustrates the voltages and signals of IC output interface module of FIG. 4 during a failsafe operation, and FIG. 10 illustrates signals of the IC output interface module of FIG. 4 during a failsafe operation. During a failsafe operation, voltage supply VDDIO is down and output pin PAD is driven to a high voltage (e.g., VPAD=10V) by an external device or a bus. Signal LMODE and LMODE_VDDIO are all low during a failsafe operation as illustrated in FIG. 10. Accordingly, NMOS transistor MN411 and MN412 are off, allowing PMOS transistors MP411 and MP413 to be connected in diode configuration respectively through PMOS transistor MP414 and resistor R411. The diode configuration of PMOS transistors MP411 and MP413 are illustrated in dotted lines in FIG. 9.

When output pin PAD is driven externally, the diode configuration of PMOS transistors MP411 and MP413 are reverse biased, preventing reverse current to voltage supply VDDIO. High-value resistors R451 and R452 may be chosen based on a design's pin budget and act as a voltage divider between output pin PAD and voltage supply VDDIO, biasing node N1 to VPAD (R451)/(R451+R452). Voltage at PGATE and NGATE is 0V, and voltage at node N2 is the same as the voltage of N1, VPAD (R451)/(R451+R452). In the absence of such biasing, voltage at node N1 will be 0V, causing voltage stress on PMOS transistor MP412 across its gate and source.

When output pin PAD is driven externally, voltage at node G2 follows VPAD because of PMOS transistor MP412 is configured to function as a diode. Current from output pin PAD to voltage supply VDDIO, IFAILSAFE, is limited due to resistors R451 and R452. The current of IFAILSAFE during a failsafe operation is VPAD/(R451+R452) and may be limited to be under 20 nA.

According to the design of output interface module 400 of FIG. 4, none of PMOS transistors MP411, MP412, and MP413 is subject to a voltage more than VPAD (R451)/(R451+R452), which can be ensured to be less than voltage VSAFE with proper selection of resistor R451 and R452. For instance, when voltage at output pin PAD, VPAD, is 10V, values of resistors R451 and R452 can be equal so that no PMOS transistors MP411, MP412, and MP413 is subject to more than 5V across its terminals.

Below table 1 shows a comparison of prior art designs and a design according to FIG. 4. Both prior art designs of FIGS. 3 and 4, and a design of FIG. 4 were subject to gate oxide stress analysis during a failsafe operation (e.g., voltage supply VDDIO is down, voltage at output pin PAD is 10V). The below table shows a comparison of the resulting failure-in-time (FIT) rate, a metric quantifying the dielectric degradation of a circuit over its entire lifetime of operation.

TABLE 1

| Design | FIT Rate at failsafe mode with VDDIO = 0, pad at 10 V |
|---|---|
| Prior Art of FIG. 2 | $3.32 \times 10^{6}$ FIT |
| Prior Art of FIG. 3 | $2.54 \times 10^{6}$ FIT |
| Design of FIG. 4 | $3.67 \times 10^{-8}$ FIT |

It is to be understood that other examples may be employed and that various structural, logical, and electrical changes may be made. Modifications are possible in the described embodiments, and other embodiments are possible, within the scope of the claims.

What is claimed is:

1. An output interface module comprising, a pull-up circuitry coupled to an internal power supply and an output pin;

a level shifter coupled to the pull-up circuitry;

a voltage regulating circuitry coupled to the pull-up circuitry; and a pull-down circuitry coupled to the pull-up circuitry and the output pin;

wherein the level shifter is configured to provide at least two different levels of turn-on voltage to the pull-up circuitry based on a voltage level of the internal power supply when voltage is provided by the internal power supply to the pull-up circuitry and a data incoming to the output interface module;

the pull-up circuitry is configured to provide the voltage provided by the internal power supply to the output pin as high logic signal based on a level of the voltage provided by the level shifter and the voltage level of the internal power supply;

the pull-down circuitry is configured to provide a voltage to the output pin as low logic signal based on the incoming data, wherein the voltage provided by the pull-down circuitry to the output pin is lower than the voltage provided by the pull-up circuitry to the output pin; and the voltage regulating circuitry is configured to distribute voltage applied to the pull-up circuitry when the internal power supply is turned off and the output pin is driven externally.

2. The output interface module of claim 1, wherein the pull-up circuitry comprises;

a first PMOS transistor coupled to the internal power supply;

a second PMOS transistor coupled to the first PMOS transistor; and a third PMPS transistor coupled to the second PMOS transistor and the output pin;

wherein a source of the first PMOS transistor is coupled to the internal power supply, a drain of the first PMOS transistor is coupled to a source of the second PMOS transistor, a drain of the second PMOS transistor is coupled to a source of the third PMOS transistor, and a drain of the third PMOS transistor is coupled to the output pin, the voltage of the internal power supply is configured to be supplied to the source of the first PMOS transistor and provided to the drain of the first PMOS transistor when the first PMOS transistor is turned on, the level shifter is configured to provide the at least two different levels of turn-on voltage to a gate of the second PMOS transistor based on the level of the voltage supplied by the internal power supply to the source of the first PMOS transistor and the incoming data, the second PMOS transistor is configured to provide the voltage provided to the drain of the first PMOS transistor by the internal power supply to the source of the third PMOS transistor when the second PMOS transistor is turned on, and the third PMOS transistor is configured to provide the voltage provided to the source of the third PMOS transistor to the output pin as the high logic signal when the third PMOS transistor is turned on.

3. The output interface module of claim 2, wherein a bulk of the first PMOS transistor is coupled to a bulk of the second PMOS transistor, and a bulk of the third PMOS transistor is coupled to the output pin, and wherein each the first PMOS transistor and third PMOS transistor is configured to be functionally equivalent to a diode preventing a current flow from the output pin to the voltage supply when the output pin is driven externally.

4. The output interface module of claim 2, wherein the first, second and third PMOS transistors are drain extended MOS transistors.

5. The output interface module of claim 2, wherein a difference between each of the at least two different levels of turn-on voltage and the level of voltage supplied by the internal power supply is within a preset range based on a voltage tolerance level of the second PMOS transistor.

6. The output interface module of claim 2, wherein the gate and the drain of the first PMOS transistor are configured to be shorted when the voltage supplied to the source of the first PMOS transistor is above a preset voltage level.

7. The output interface module of claim 6, wherein the pull-up circuitry further comprises a fourth PMOS transistor coupled to the first PMOS transistor, wherein a source of the fourth PMOS transistor is coupled to the gate of the first PMOS transistor and a drain of the fourth PMOS transistor is coupled to the drain of the first PMOS transistor, and wherein the fourth PMOS transistor is configured to be turned on to short the gate and the drain of the first PMOS transistor when the voltage supplied to the source of the first PMOS transistor is above the preset voltage level.

8. The output interface module of claim 2, wherein the level shifter is configured to turn on the second PMOS transistor to generate the high logic data and turn off the second PMOS transistor when the pull-down circuitry generates the low logic data.

9. The output interface module of claim 8, wherein the level shifter is configured to turn on the second PMOS transistor to generate the high logic data by applying a lower of the at least two different levels of turn-on voltage to the gate of the second PMOS transistor when the voltage supplied to the source of the first PMOS transistor is below a preset voltage level.

10. The output interface module of claim 8, wherein the level shifter is configured to turn on the second PMOS transistor to generate the high logic data by applying a higher of the at least two different levels of turn-on voltage to the gate of the second PMOS transistor when the voltage supplied to the source of the first PMOS transistor is above a preset voltage level.

11. The output interface module of claim 2, wherein the pull-down circuitry comprises a NMOS transistor of which a source is coupled to the drain of the PMOS transistor and a source is coupled to a ground, and wherein the NMOS transistor is configured to be turned off when the second PMOS transistor is turned on, and vice versa.

12. An output interface buffer comprising, a pull-up circuitry coupled to an internal power supply and an output pin;

a pull-down circuitry coupled to a around and the output pin; and a voltage regulating circuitry coupled to the pull-up circuitry, wherein the pull-up circuitry is configured to provide a voltage supplied by the internal power supply to the output pin as a high logic signal based on a high data incoming to the output interface buffer, the pull-down circuitry is configured to provide a low or zero voltage from the around to the output pin as a low logic signal based on a low data incoming to the output interface butter, and the voltage regulating circuitry is configured to distribute voltage applied to the pull-up circuitry when the internal power supply is turned off and the output pin is driven externally;

wherein the pull-up circuitry comprises;

a first PMOS transistor coupled to the internal power supply;

a second PMOS transistor coupled to the first PMOS transistor; and a third PMPS transistor coupled to the second PMOS transistor and the output pin;

wherein a source of the first PMOS transistor is coupled to the internal power supply, a drain of the first PMOS transistor is coupled to a source of the second PMOS transistor, a drain of the second PMOS transistor is coupled to a source of the third PMOS transistor, and a drain of the third PMOS transistor is coupled to the output pin, the voltage of the internal power supply is configured to be supplied to the source of the first PMOS transistor and provided to the drain of the first PMOS transistor when the first PMOS transistor is turned on, the second PMOS transistor is configured to provide the voltage provided to the drain of the first PMOS transistor by the internal power supply to the source of the third PMOS transistor when the second PMOS transistor is turned on, and the third PMOS transistor is configured to provide the voltage provided to the source of the third PMOS transistor to the output pin as the high logic signal when the third PMOS transistor is turned on;

wherein a bulk of the first PMOS transistor is coupled to a bulk of the second PMOS transistor, and a bulk of the third PMOS transistor is coupled to the output pin, and wherein each the first PMOS transistor and third PMOS transistor is configured to be functionally equivalent to a diode preventing a current flow from the output pin to the voltage supply when the output pin is driven externally.

13. An output interface buffer comprising, a pull-up circuitry coupled to an internal power supply and an output pin;

a pull-down circuitry coupled to a around and the output pin; and a voltage regulating circuitry coupled to the pull-up circuitry, wherein the pull-up circuitry is configured to provide a voltage supplied by the internal power supply to the output pin as a high logic signal based on a high data incoming to the output interface buffer, the pull-down circuitry is configured to provide a low or zero voltage from the around to the output pin as a low logic signal based on a low data incoming to the output interface butter, and the voltage regulating circuitry is configured to distribute voltage applied to the pull-up circuitry when the internal power supply is turned off and the output pin is driven externally;

wherein the pull-up circuitry comprises;

a first PMOS transistor coupled to the internal power supply;

a second PMOS transistor coupled to the first PMOS transistor; and a third PMPS transistor coupled to the second PMOS transistor and the output pin;

wherein a source of the first PMOS transistor is coupled to the internal power supply, a drain of the first PMOS transistor is coupled to a source of the second PMOS transistor, a drain of the second PMOS transistor is coupled to a source of the third PMOS transistor, and a drain of the third PMOS transistor is coupled to the output pin, the voltage of the internal power supply is configured to be supplied to the source of the first PMOS transistor and provided to the drain of the first PMOS transistor when the first PMOS transistor is turned on, the second PMOS transistor is configured to provide the voltage provided to the drain of the first PMOS transistor by the internal power supply to the source of the third PMOS transistor when the second PMOS transistor is turned on, and the third PMOS transistor is configured to provide the voltage provided to the source of the third PMOS transistor to the output pin as the high logic signal when the third PMOS transistor is turned on;

the voltage regulating circuitry comprises at least two resistors coupled in series, and wherein an end of a first resistor of the at least two resistors is coupled to the source of the first PMOS transistor and another end of the first resistor is coupled to the drain of the first PMOS transistor, an end of a second resistor of the at least two resistors is coupled to the source of the second PMOS transistor and another end of the second resistor is coupled to the drain of the third PMOS transistor, and a resistance value of the first and second resistors is selected to distribute a voltage applied to the pull-up circuitry and apply a voltage below a voltage tolerance level of each of the first, second, and third PMOS transistors to a respective one of the first, second, and third PMOS transistors.

* * * * *